United States Patent [19]
Nakamura

[11] Patent Number: 5,917,364
[45] Date of Patent: Jun. 29, 1999

[54] BI-DIRECTIONAL INTERFACE CIRCUIT OF REDUCED SIGNAL ALTERATION

[75] Inventor: Kazuyuki Nakamura, Tokyo, Japan

[73] Assignee: NEC Corporation, Tokyo, Japan

[21] Appl. No.: 08/997,664

[22] Filed: Dec. 23, 1997

[30] Foreign Application Priority Data

Dec. 25, 1996 [JP] Japan ................................. 8-344866

[51] Int. Cl.$^6$ .......................................... H03K 19/0175
[52] U.S. Cl. ........................ 327/415; 326/105; 341/143
[58] Field of Search ................................ 365/4, 81, 89, 365/230.06; 341/160, 161, 143, 51; 326/30, 105; 327/141, 291, 293, 595, 415

[56] References Cited

U.S. PATENT DOCUMENTS

| | | | |
|---|---|---|---|
| 5,384,808 | 1/1995 | Van Brunt et al. ........................ | 375/36 |
| 5,726,567 | 3/1998 | Lewis et al. ........................ | 324/207.16 |
| 5,805,693 | 9/1998 | Chang et al. ........................... | 379/352 |

OTHER PUBLICATIONS

Nakamura, Kazuyuki et al., "A 50% Noise Reduction Interface Using Low-Weight Coding ", *1996 Symposium on VLSI Circuits: Digest of Technical Papers;* pp. 144–145 (1996).

*Primary Examiner*—My-Trang Nu Ton
*Attorney, Agent, or Firm*—Scully, Scott, Murphy & Presser

[57] ABSTRACT

To provide a bi-directional interface circuit which can reduce the simultaneous switching noise and the power consumption even at transitions of the signal direction, a bi-directional interface circuit of the invention comprises: an encoder (10) for generating an output bit sequence in synchronous with a clock cycle of the bus lines, said output bit sequence being obtained by coding an original signal and a redundant bit so that signal alteration rate of the output bit sequence to a preceding bit sequence thereof is less than a half; a decoder (20) for decoding the input bit sequence into an original bit sequence; and bypass lines (3) for bypassing the input bit sequence to the encoder for enabling the encoder to refer to the input bit sequence as the preceding bit sequence when the LSI chip begins to transfer the original signal. By providing a first encoder for generating an intermediate bit sequence having less than half logic '1' bits, and a second encoder for switching bit logic when corresponding bit of the intermediate bit sequence is logic '1', the signal delay of the bypassed input bit sequence can be reduced and I/O clock frequency is not restricted.

2 Claims, 5 Drawing Sheets

BI-DIRECTIONAL INTERFACE CIRCUIT OF REDUCED SIGNAL ALTERATION

BACKGROUND OF THE INVENTION

The present invention relates to an interface circuit of an LSI (Large Scale Integrated Circuit) with external bus lines, wherein low I/O (Input/Output) noise and low power consumption are realized by coding/decoding I/O signal so as to reduce status alteration thereof.

A low-weight coding is proposed recently for reducing the I/O noise and the power consumption by way of changing high-level (logic '1') bits' rate or level alteration rate of binary parallel signals exchanged through bus lines by adding a redundant bit.

In the case of CMOS type interface circuit, through current flows for charging/discharging bus lines when signal bit status alters from low level to high level or vice versa. Therefore, current consumption of the CMOS type interface circuit increases in proportion to frequency of the bit status alteration (or switching). Furthermore, so called the simultaneous switching noise is derived when the majority bits alter their status because of voltage fluctuation induced by parasitic inductance of power supply lines themselves, owing to peak current flowing from the power supply or flowing to the ground.

This simultaneous switching noise, which degrades operational margin of the LSI, can be reduced by coding the binary signal so as to reduce the level alteration rate thereof.

The above coding technique is realized in a concrete LSI for the first time by us and its effective results to improve LSI interface performance is reported to 1996 IEEE Symposium, (pp. 144–145, 1996 Symposium on VLSI Circuits Digest of Technical Papers). FIG. 3 is a circuit diagram illustrating an example of coding/decoding circuits for reducing the level alteration rate.

The example of FIG. 3 applied to 8-bits' signal has an encoder 1 provided on an LSI chip A for encoding an output 8-bits' signal, and a decoder 2 provided on another LSI chip B for decoding a signal received from the encoder 1. For transmitting the 8-bits' signal, the encoder 1 converts the 8-bits' signal into a 9-bits' signal adding a redundant bit, which is transferred through bus lines 9b of 9-bits' width. Signs \8 and \9 marked on signal lines of FIG. 3 represent parallel bus lines of 8 and 9-bits' width, respectively, while signs x8 or x9 marked on circuit symbols represent that there are eight or nine circuit elements each connected to each of the parallel bus lines of 8 or 9-bits' width, respectively.

The encoder 1 comprises a first XOR (eXclusive OR) gate unit XOR1, a majority discrimination circuit 11, a second XOR gate unit XOR2, and a register 12 for outputting the 9-bits' signal to bus lines 9b through an output buffer OB.

The encoder 1 operates as follows.

Input 8-bits' signal is added with an MSB (Most Significant Bit) of logic '0', which makes input 9-bits' signal. The first XOR gate unit XOR1 compares the input 9-bits' signal to output 9-bits' signal to be supplied to the output buffer OB from the register 12 and generates XOR logic of each 9 bit of the input 9-bits' signal and corresponding each bit of the output 9-bits' signal for obtaining logic difference between corresponding bits of the two signals. For example, when logic of the two signals is "010101010" and "101010101", XOR logic of the two signals becomes "111111111", while it becomes "000000000" when the two signals have the same logic.

The majority discrimination circuit 11 discriminates whether bits of the input 9-bits' signal, that is, the signal to be output at next clock, of different logic compared to the output 9-bits' signal actually being output, are the majority or not, by comparing bit number of logic '1' to that of logic '0' of output of the first XOR gate unit XOR1. When different bits are found to be the majority, the majority discrimination circuit 11 output a discrimination signal of logic '1', and logic of every bit of the input 9-bits' signal is inverted by the second XOR gate unit XOR2 which outputs XOR logic of each bit of the input 9-bits' signal and the discrimination signal. Output of the second XOR gate unit XOR2 is registered in the register 12 to be output at the next clock through the output buffer OB to the bus lines 9b.

Thus, the status alteration number of the output 9-bits' signal on the bus lines 9b is always maintained less than half of its bit width.

FIG. 4 is a circuit diagram illustrating an example reported in the above Symposium of the majority discrimination circuit 11.

In the majority discrimination circuit 11 of FIG. 4, logic (x0, x1, ..., x8) of each bit X0 to X8 of output of the first XOR gate unit XOR1 is connected to each gate of a parallel connection of 9 nMOSFETs MN10 to MN18, while inverted logic (x0_, x1_, ..., x8_) of each thereof is connected to each gate of another parallel connection of 9 nMOSFETs MN10_ to MN18_. The parallel connection of the 9 nMOSFETs MN10 to MN18 is connected between a constant current supply composed of an nMOSFET MNCS1 and a drain of a first pMOSFET MP11 of an operational amplifier and the other parallel connection of the nMOSFETs MN10_ to NM18_ is connected between the constant current supply and a drain of a second pMOSFET MP12 of the operational amplifier. Output terminal RES is connected to the drain of the second pMOSFET MP12.

Either of the first and the second pMOSFET MP11 and MP12 which is connected to the constant current supply through lower ON resistance of the two parallel connections becoming ON, the majority discrimination circuit 11 outputs the majority logic of the output of the first XOR gate unit XOR1.

The majority discrimination circuit 11 is the most complicated part of the coding/decoding circuit of FIG. 3 and takes the longest operational time.

Returning to FIG. 3, the decoder 2 of the LSI chip B, comprising a third XOR gate unit XOR3 checks the MSB of the received 9-bits' signal. When logic of the MSB is '0', lower 8 bits are output as they are, and they are all inverted when logic of the MSB is '1'. Thus, the original 8-bits' signal is obtained. The above decoding can be performed by obtaining XOR logic of the MSB and each of the lower 8 bits of the received 9-bits' signal by the third XOR gate unit XOR3.

Although the coding/decoding circuits of FIG. 3 need one additional bus line for the redundant bit, they can reduce the simultaneous switching noise and the power dissipation into half at most by limiting the simultaneous alteration number within a half.

The coding/decoding circuits of FIG. 3 can reduce level alteration rate of signals transmitted through the bus lines 9b when the signals flow unidirectionally from the LSI chip A to the LSI chip B successively, coded by the encoder 1 by referring to outputting signals registered in the register 12. However, when the signals are transmitted bi-directionally on the same bus lines 9b, the above low-weight coding cannot reduce the signal level alteration at each transition of signal direction, transition between a signal from the LSI chip A to the LSI chip B and that from the LSI chip B to LSI chip A, for example, resulting in a simultaneous switching noise or a power dissipation at the transition. This is because the coding is performed without referring to receiving signals, as will be described referring to FIG. 5.

FIG. 5 is a circuit diagram illustrating an example wherein an LSI chip A and an LSI chip B, both simply provided with a coding and a decoding circuit, are connected through bus lines 9b.

In the bi-directional interface circuits of FIG. 5, there should be taken in consideration changes of signal direction that the LSI chip A transfers a signal to the LSI chip B just after receiving a signal from the LSI chip B, for example. When receiving signals from the LSI chip B in succession, the interface circuit of the LSI chip B can encode the signals on the bus lines 9b appropriately so that the level switching of the signals is maintained within half of the bit width. However, when a signal is transferred from the LSI chip A to the LSI chip B after signal succession from the LSI chip B, the encoder 1A of the LSI chip A cannot be informed of bit sequence on the bus lines 9b at preceding clock, being unable to generate a low-weight code having level alteration rate less than half. Therefor, there may occur, at worst, level alteration of all 9 bits, resulting in a still larger noise than that generated when the original 8-bits' signal is transferred without coding.

SUMMARY OF THE INVENTION

Therefore, a primary object of the present invention is to provide a bi-directional interface circuit of reduced signal alteration which can reduce the simultaneous switching noise and the power consumption even at transitions of the signal direction.

In order to achieve the object, a bi-directional interface circuit of reduced signal alteration according to an embodiment of the invention comprises:

an encoder circuit for generating an output bit sequence to be transferred to bus lines in synchronous with a clock cycle of the bus lines, said output bit sequence being obtained by coding an original signal to be transferred and a redundant bit so that signal alteration rate of the output bit sequence, compared to a preceding bit sequence a thereof transmitted on the bus lines, is less than a half;

an output buffer for driving the bus lines according to the output bit sequence;

an input buffer for receiving an input bit sequence transmitted on the bus lines;

a decoder for decoding the input bit sequence into an original bit sequence to be received; and bypass lines for bypassing the input bit sequence to the encoder for enabling the encoder to refer to the input bit sequence as the preceding bit sequence when the LSI chip begins to transfer the original signal.

A bi-directional interface circuit of reduced signal alteration according to another embodiment of the invention comprises:

a first encoder for generating an intermediate output bit sequence in synchronous with a clock cycle of bus lines, said intermediate output bit sequence being an original output bit sequence and a redundant bit of logic '0' when majority bits of the original output bit sequence have logic '0', and the intermediate output bit sequence being an inverted bit sequence of the original output bit sequence and a redundant bit of logic '1' when majority bits of the original output bit sequence have logic '1';

a second encoder circuit for generating an output bit sequence whereof signal alteration rate is less than a half, each bit of the output bit sequence having XOR logic of respective bits of the intermediate output bit sequence and a preceding bit sequence thereof transmitted on the bus lines;

an output buffer for driving the bus lines according to the output bit sequence;

an input buffer for receiving an input bit sequence transmitted on the bus lines;

a second decoder for decoding the input bit sequence into an intermediate input bit sequence, each bit of the intermediate input bit sequence having XOR logic of respective bits of the input bit sequence and a preceding bit sequence thereof transmitted on the bus lines;

a first decoder for decoding the intermediate input bit sequence into an original input bit sequence to be received, by outputting bits of the intermediate input bit sequence other than the redundant bit as they are when logic of the redundant bit is '0', and inverting logic of bits of the intermediate input bit sequence other than the redundant bit when logic of the redundant bit is '1'; and bypass lines for bypassing the input bit sequence to the second encoder for enabling the second encoder to refer to the input bit sequence as the preceding bit sequence when the LSI chip begins to transfer the output signal.

Therefore, the interface circuit of the invention can perform the low-weight coding appropriately even at transition of signal direction, always reducing the simultaneous switching noise and the power consumption, and without restricting the I/O clock frequency, in the latter embodiment.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings.

DETAILED DESCRIPTION OF THE PREFERRED EMBODIMENTS

Now, embodiments of the present invention will be described in connection with the drawings.

Figure 1:
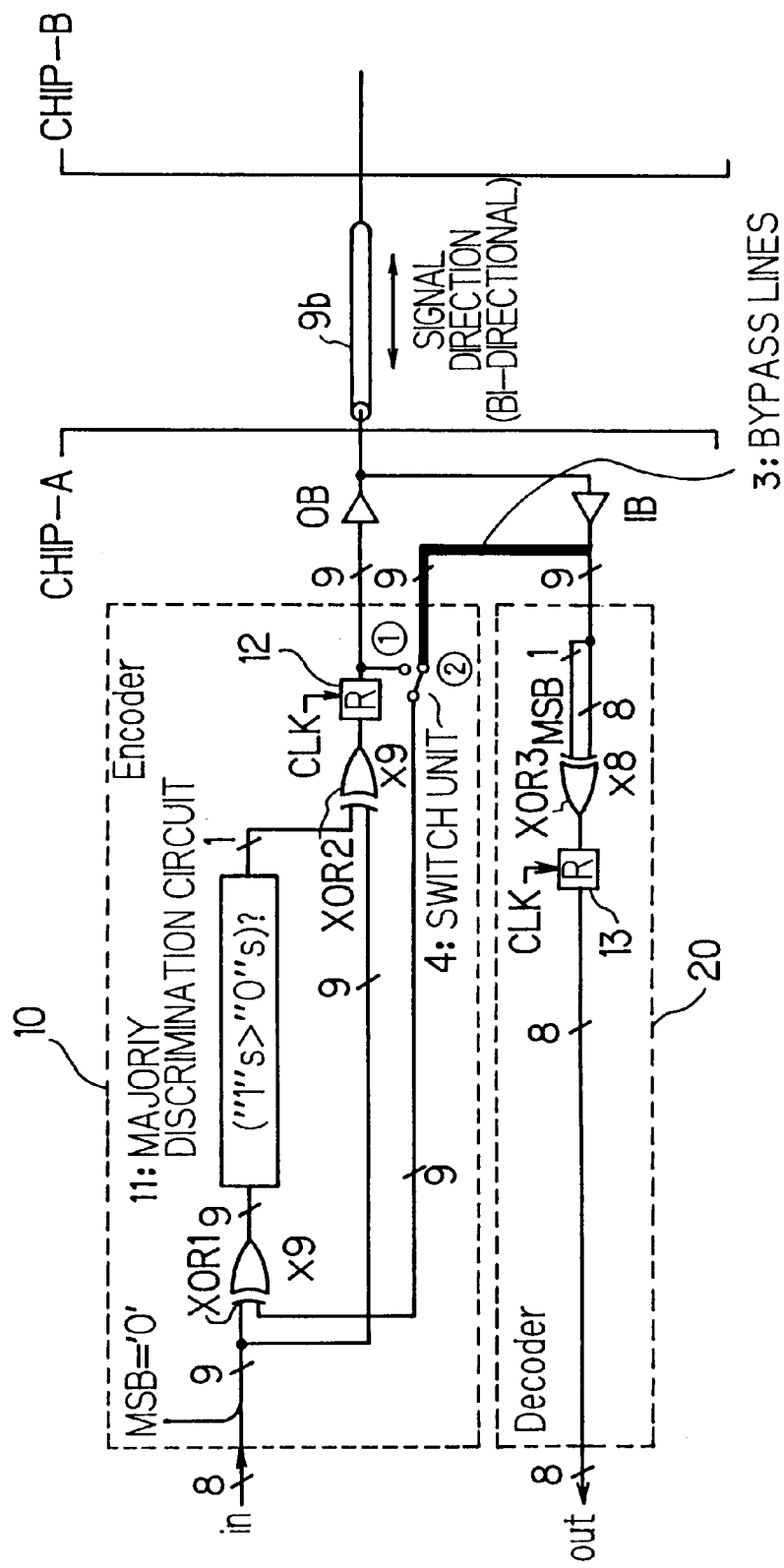
FIG. 1 is a circuit diagram illustrating an interface circuit according to an embodiment of the invention provided on a LSI chip A.

FIG. 1 is a circuit diagram illustrating an interface circuit according to an embodiment of the invention provided on a LSI chip A, comprising an encoder 10 and a decoder 20. Compared to the interface circuits of FIG. 5, bypass lines 3 and a switch unit 4 are further provided in the interface circuit of the LSI chip A of FIG. 1. The interface circuit of the LSI chip B, which is not depicted in FIG. 1, has the same configuration.

The switch unit 4 is controlled to connect receiving signal through an input buffer IB and the bypass lines 3 to the first XOR gate unit XOR1 during the LSI chip A is receiving signals. Therefore, when the LSI chip A begins to send a signal to the bus lines 9b, the encoder 10 can generates the low-weight code of less than half level alteration to the preceding bit sequence on the bus lines 9b by referring to the last bit sequence output of the input buffer IB.

Figure 5:
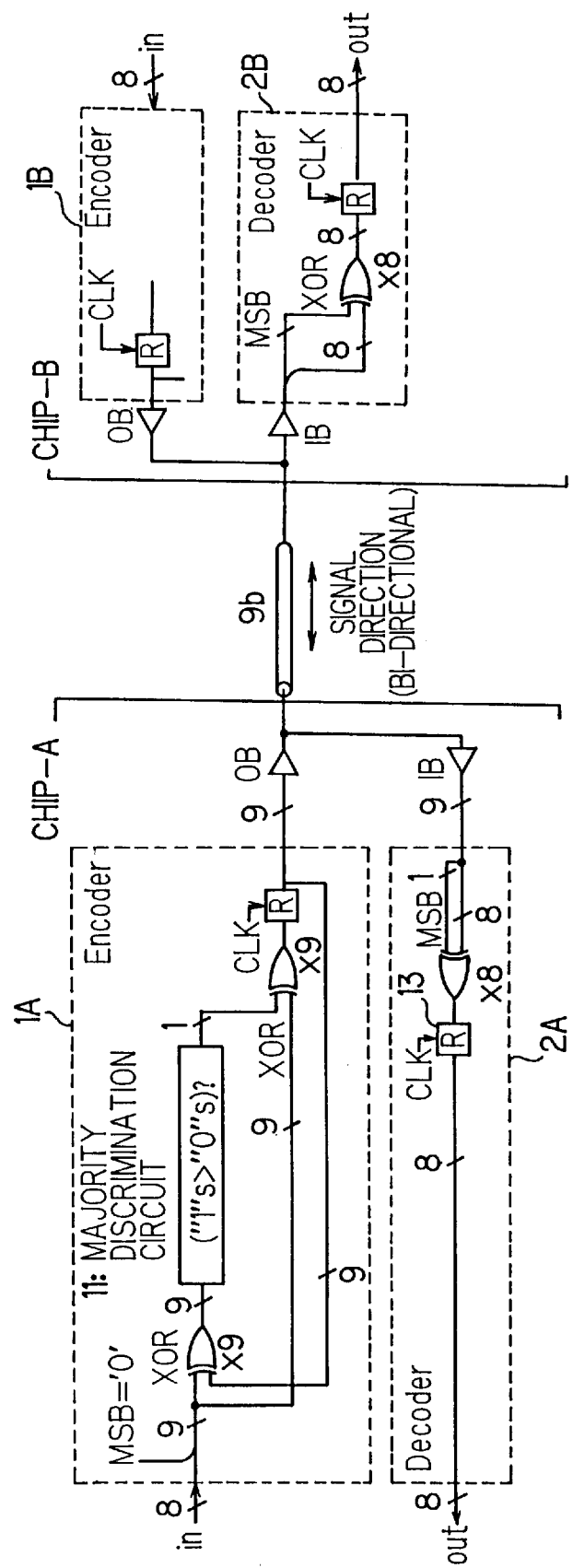
FIG. 5 is a circuit diagram illustrating an example of an LSI chip A and an LSI chip B connected bi-directionally through a bus lines 9b.

When the LSI chip A itself is driving the bus lines 9b, the switch unit 4 is controlled to connect output of the register 12 to the first XOR gate unit XOR1 and the encoder 10 operates in the same way with the encoder 1A of FIG. 5.

Thus, the encoder 10 of the embodiment can perform the low-weight coding appropriately even at transitions of signal direction.

Figure 2:
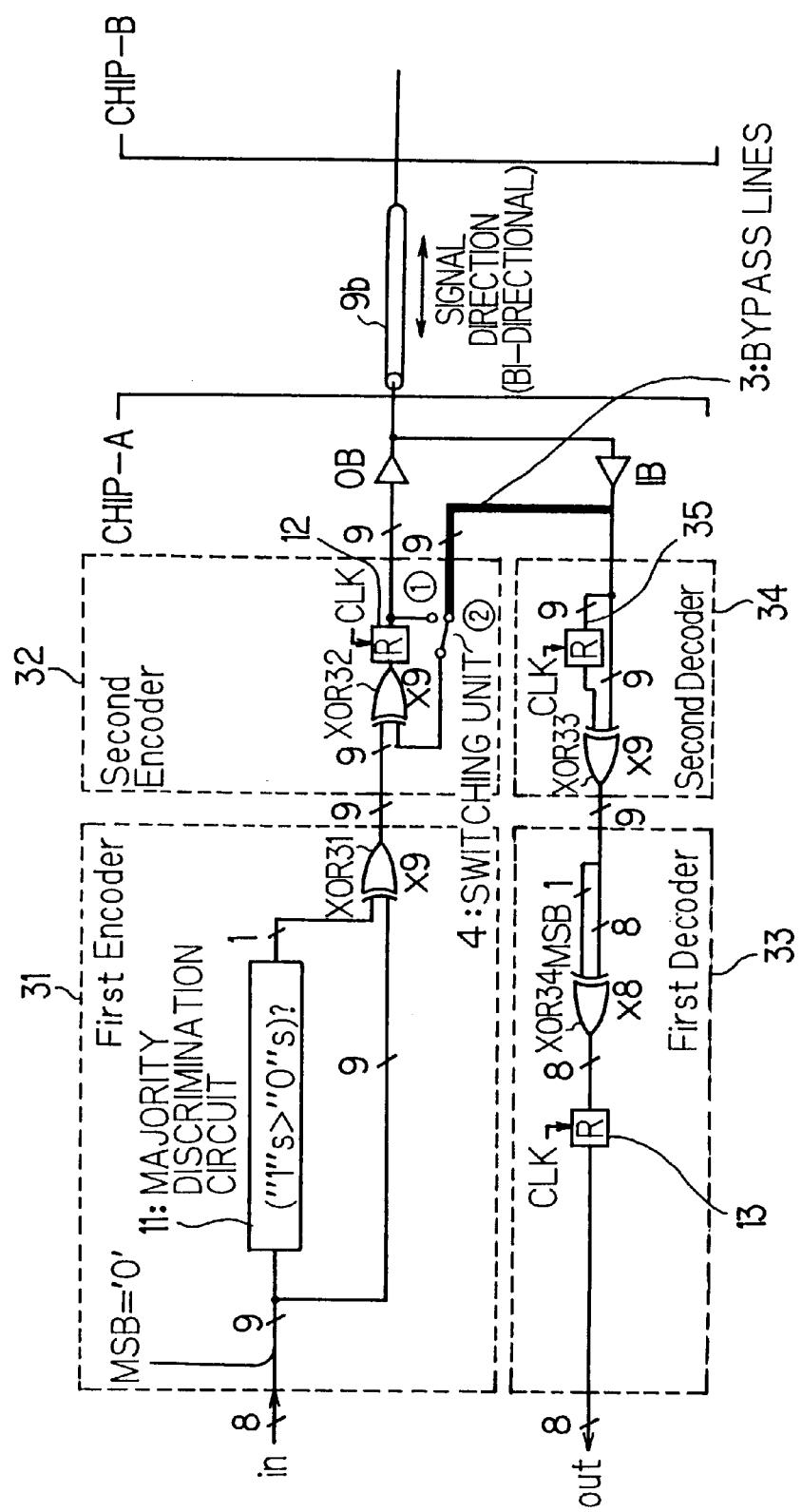
FIG. 2 is a block diagram illustrating an interface circuit according to another embodiment of the invention.
Figure 3:
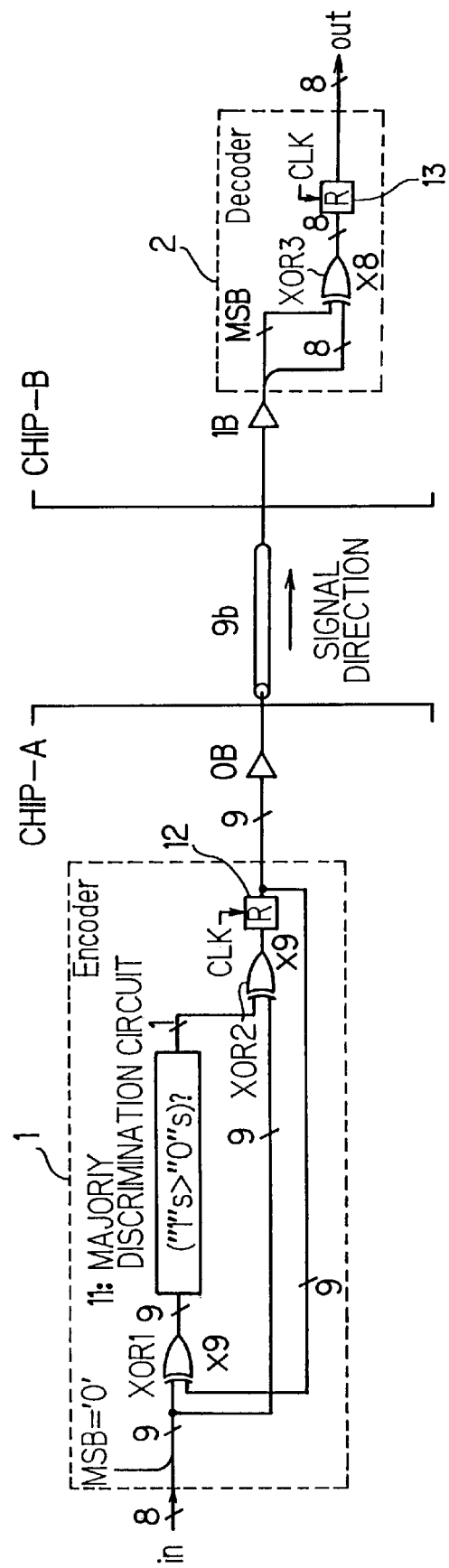
FIG. 3 is a circuit diagram illustrating an example of conventional coding/decoding circuits for reducing the level alteration rate.

FIG. 2 is a block diagram illustrating an interface circuit provided on an LSI chip A according to another embodiment of the invention.

Referring to FIG. 2, the interface circuit has a first encoder 31, a second encoder 32, a first decoder 33 and a second decoder 34.

First, the low-weight coding of the interface circuit performed when the LSI chip A is driving bus lines 9b is described.

The first encoder 31 comprises a majority discrimination circuit 11 and a first XOR gate unit XOR31.

Figure 4:
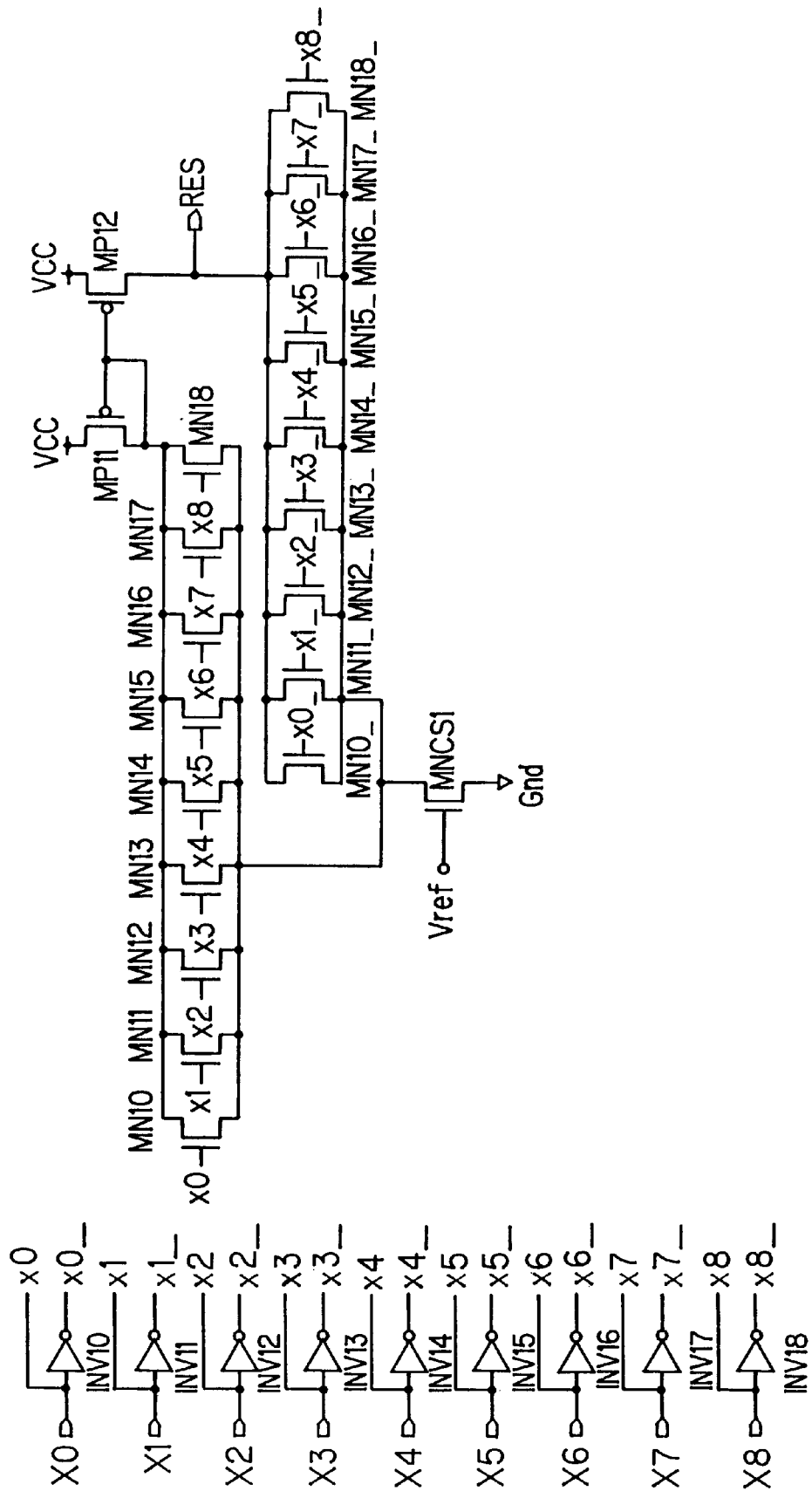
FIG. 4 is a circuit diagram illustrating an example the majority discrimination circuit 11 of FIG. 3.

An input 8-bits' signal is added with an MSB having logic '0' and input to the majority discrimination circuit 11 having the same configuration with that of FIG. 4, which outputs a discrimination signal having logic '1' when bits of logic '1' are the majority of the 9 bits in the input 9-bits' signal, and otherwise, the discrimination signal having logic '0'.

The first XOR gate unit XOR31 inverts the input 9-bits' signal when the discrimination signal is logic '1' in the same way with the second XOR gate unit XOR2 of FIG. 1. Thus, the first encoder 31 of FIG. 2 outputs an intermediate 9-bits' signal wherein number of logic '1' bits is always less than half.

The second encoder 32 has a second XOR gate unit XOR32, a register 12 for registering output of the second XOR gate unit XOR32 and a switch unit 4 controlled to connect output of the register 12 to the second XOR gate unit XOR32 when the LSI chip A is outputting signals.

The intermediate 9-bits' signal and output of the register 12 through the switch 4 are input to the second XOR gate unit XOR32, which outputs a bit sequence, each bit thereof having XOR logic of corresponding bits of the intermediate 9-bits' signal and a preceding bit sequence being output. Therefore, in the bit sequence output of the second XOR gate unit XOR32, bits corresponding to logic '0' bits of the intermediate 9-bits' signal does not change their logic, and only bits corresponding to logic '1' bits of the intermediate 9-bits' signal, which are coded to be less than half, change their logic at every clock, such as '0', '1', '0', . . . .

Thus, the low-weight coding is performed in a similar way to the interface circuit of FIG. 1.

When receiving the coded 9-bits' signal, it is first processed by the second decoder 34. The second decoder 34 has a register 35 and a third XOR gate unit XOR33. The received bit sequence and its preceding bit sequence registered in the register 35 are input to the third XOR gate unit XOR33, which outputs a bit sequence, each bit thereof having XOR logic of corresponding bits of the received bit sequence and its preceding bit sequence, in a similar way with the second XOR gate unit XOR32. Thus, the received 9-bits' signal is decoded into the same signal with the intermediate 9-bits' signal, the level alteration/unalteratin of the received 9-bits' signal being converted into bit logic '1/0'.

Then, output of the second decoder 34 is decoded by the first decoder 33 having a fourth XOR gate unit XOR34, which inverts lower 8 bits of the output of the second decoder 34 when logic of the MSB is '1', and outputs the lower 8 bits as they are when logic of the MSB is '0'.

Thus, the received 9-bits' signal is decoded into original 8-bits' signal, in the embodiment of FIG. 2.

Here, when the LSI chip A is not driving the bus lines 9b, the switch 4 of the second encoder 32 is controlled to input the received 9-bits' signal to the second XOR gate unit XOR32 through bypass lines 3, in the similar way to the interface circuit of FIG. 1. Therefore, when the signal direction is changed and the LSI chip A begins to drive the bus lines 9b, the second encoder 32 generates a first bit sequence to be transferred by altering bit logic of the last bit sequence of the received 9-bits' signal according to logic '1' bits of the intermediate 9-bits' signal.

Thus, the low-weight coding/decoding can be performed continuously regardless of signal direction transition, in the same way with the embodiment of FIG. 1.

Compared to the embodiment of FIG. 1, the embodiment of FIG. 2 needs one more register (35) and one more XOR gate unit (XOR32). This is a demerit. However, the last bit sequence of the received 9-bits' signal is input directly to the second XOR gate unit XOR32, that is, the last bit sequence is not necessary to be processed but only through the second XOR gate unit XOR32 until the first bit sequence to be transferred is prepared in the register 35, in the embodiment of FIG. 2.

In the embodiment of FIG. 1, on the other hand, the last bit sequence is necessary to be processed through the first XOR gate circuit XOR1, then, through the majority discrimination circuit 11 and the second XOR gate unit XOR2, until the first bit sequence to be transferred is prepared in the register 12. Among them, the majority discrimination circuit 11 takes a fairly long operational time, as previously described. Therefore, the I/O clock cycle should be restricted within a certain frequency because of operational delay of the last bit sequence processed through the first XOR gate circuit XOR1, the majority discrimination circuit 11 and the second XOR gate unit XOR2, in the embodiment of FIG. 1.

This demerit can be eliminated in the embodiment of FIG. 2 wherein the last bit sequence can be input directly to the second XOR gate unit XOR32, enabling a more high frequency I/O clock cycle.

This is the merit of the embodiment of FIG. 2.

Thus, a bi-directional interface circuit for LSI chips of low power consumption and low simultaneous switching noise can be realized according to the present invention without restricting the I/O clock frequency.

Heretofore, the invention is described in connection with embodiments applied to bus lines of 8-bits' width. However, it goes without saying that the present invention is applicable to interface circuit of any bit width in the scope of the invention.

What is claimed is:

1. A bi-directional interface circuit of reduced signal alteration provided on a LSI chip; said interface circuit comprising:

an encoder circuit for generating an output bit sequence to be transferred to bus lines in synchronous with a clock cycle of the bus lines, said output bit sequence being obtained by coding an original signal to be transferred and a redundant bit so that signal alteration rate of said output bit sequence to a preceding bit sequence thereof transmitted on the bus lines is less than a half;

an output buffer for driving the bus lines according to said output bit sequence;

an input buffer for receiving an input bit sequence transmitted on the bus lines;

a decoder for decoding said input bit sequence into an original bit sequence to be received; and bypass lines for bypassing said input bit sequence to said encoder for enabling said encoder to refer to said input bit sequence as said preceding bit sequence when the LSI chip begins first to transfer said original signal after receiving a signal.

2. A bi-directional interface circuit of reduced signal alteration provided on a LSI chip; said interface circuit comprising:

a first encoder for generating an intermediate output bit sequence in synchronous with a clock cycle of bus lines, said intermediate output bit sequence being an original output bit sequence and a redundant bit of logic '0' when majority bits of said original output bit sequence have logic '0', and said intermediate output bit sequence being an inverted bit sequence of said original output bit sequence and a redundant bit of logic '1' when majority bits of said original output bit sequence have logic '1';

a second encoder circuit for generating an output bit sequence whereof signal alteration rate is less than a half, each bit of said output bit sequence having XOR logic of respective bits of said intermediate output bit sequence and a preceding bit sequence threrof transmitted on the bus lines;

an output buffer for driving the bus lines according to said output bit sequence;

an input buffer for receiving an input bit sequence transmitted on the bus lines;

a second decoder for decoding said input bit sequence into an intermediate input bit sequence, each bit of said intermediate input bit sequence having XOR logic of respective bits of said input bit sequence and a preceding bit sequence thereof transmitted on the bus lines;

a first decoder for decoding said intermediate input bit sequence into an original input bit sequence to be received, by outputting bits of said intermediate input bit sequence other than said redundant bit as they are when logic of said redundant bit is '0', and inverting bits of said intermediate input bit sequence other than said redundant bit when logic of said redundant bit is '1'; and bypass lines for bypassing said input bit sequence to said second encoder for enabling said second encoder to refer to said input bit sequence as said preceding bit sequence when the LSI chip begins first to transfer said output signal after receiving a signal.

\* \* \* \* \*